United States Patent
Ohwa

(10) Patent No.: US 6,303,957 B1
(45) Date of Patent: Oct. 16, 2001

(54) SEMICONDUCTOR CAPACITANCE DEVICE AND SEMICONDUCTOR DEVICES USING THE SAME

(75) Inventor: Yoshihito Ohwa, Yamanashi-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/194,177
(22) PCT Filed: Mar. 24, 1998
(86) PCT No.: PCT/JP98/01264
  § 371 Date: May 11, 1999
  § 102(e) Date: May 11, 1999
(87) PCT Pub. No.: WO98/43298
  PCT Pub. Date: Oct. 1, 1998

(30) Foreign Application Priority Data

Mar. 24, 1997 (JP) .................................................. 9-070257

(51) Int. Cl.[7] ..................... H01L 27/108; H01L 29/00; H01L 31/119; H01L 29/76
(52) U.S. Cl. ..................... 257/307; 257/296; 257/532; 257/299; 257/313; 257/386
(58) Field of Search ..................... 257/307, 296, 257/532, 386, 299, 313

(56) References Cited

U.S. PATENT DOCUMENTS

| | | | |
|---|---|---|---|
| 4,001,869 | * | 1/1977 | Brown ..................... 357/51 |
| 4,278,989 | * | 7/1981 | Baba et al. ..................... 357/59 |
| 5,420,449 | * | 5/1995 | Oji ..................... 257/307 |
| 5,960,291 | * | 9/1999 | Krikapic ..................... 438/286 |
| 5,965,928 | * | 10/1999 | Nagura ..................... 257/532 |
| 6,011,723 | * | 1/2000 | Atsumi et al. ..................... 365/185.27 |

FOREIGN PATENT DOCUMENTS

| | | | |
|---|---|---|---|
| A-59-55047 | 3/1984 | (JP) . | |
| U-5-25743 | 4/1993 | (JP) . | |
| A-5-82733 | * | 4/1993 | (JP) ..................... 257/532 |
| A-6-132477 | 5/1994 | (JP) . | |

* cited by examiner

Primary Examiner—Stephen D. Meier
Assistant Examiner—James Mitchell
(74) Attorney, Agent, or Firm—Oliff & Berridge, PLC

(57) ABSTRACT

A semiconductor capacitance device comprising a first semiconductor capacitive element (30) having a first voltage dependency factor K1 (<0), a second semiconductor capacitive element (32) having a second voltage dependency factor K2 (>0) with a gradient sign inverse to the first voltage dependency factor K1, and wiring layers (24, 28) connecting the first and second capacitive elements either in parallel or in series. The first capacitive element (30) has a first doped polysilicon layer (14) of N-type and a second doped polysilicon layer (18) of N-type placed across an interposed dielectric layer (16). The second capacitive element (32) has the first doped polysilicon layer (14) of N-type and a third doped polysilicon layer (20) of P-type placed across the interposed dielectric layer (16). When the effective areas of the first and second capacitive elements (30) and (32) are defined as S1 and S2, the capacitance per unit area of each element (30) and (32) facing the dielectric layer as $C_o$, and the potential applied as E, the total combined capacitance C becomes:

$$C_o(S1+S2) \times = [1+E\{K1 \cdot S1/(S1+S2)+K2 \cdot S2/(S1+S2)\}].$$

Since the signs of K1 and K2 are inverse to each other, the voltage dependency of the total combined capacitance C is reduced.

23 Claims, 12 Drawing Sheets

SEMICONDUCTOR CAPACITANCE DEVICE AND SEMICONDUCTOR DEVICES USING THE SAME

TECHNICAL FIELD

The present invention relates to a semiconductor capacitance device and semiconductor devices such as an analogue integrated circuit using the same. More specifically, the present invention relates to an improvement accomplished with respect to reduction in voltage-dependent capacitance fluctuation.

DESCRIPTION OF THE BACKGROUND ART

As a prior art technique to precisely build a stable capacitive element on a semiconductor substrate, a capacitive element comprising double polysilicon layers 4 and 6 as illustrated in FIG. 25 and its cross-sectional view FIG. 26 across the A–A' plane can be mentioned by way of example. As shown in the figures, a dielectric layer 3 is formed on a semiconductor substrate 1, above that a first doped polysilicon layer 4, another dielectric layer 5, and a second polysilicon layer 6 are formed. Note that a well 2 as shown in FIG. 26 is generally used to shield the capacitive element from electrical noises propagated from the semiconductor substrate 1. Further, as shown on FIG. 25, wiring 7A and 7B is connected to the first and second polysilicon layers 4 and 6 via a contact holes 8A and 8B, respectively.

However, since electrodes comprising the capacitive element are semiconductors, depletion layers tend to form on the surface of the electrodes based on the voltage applied, resulting in voltage dependent fluctuations in capacitance of the capacitive element. One of the possible methods to alleviate the above performance fluctuation is to raise the impurity concentration of the polysilicon electrode. Yet, because the polysilicon electrodes of the capacitive element are formed concurrently in a MOS fabrication process, increasing the impurity concentration is not readily allowed just for accommodating needs on the side of the capacitive element alone.

Although there is an alternative method such as one disclosed in the Japanese Patent Application Laid-Open No. 6-69522/1994, wherein the impurity concentration of the region near the surface of electrodes contacting the dielectric layer between the electrode layers is increased to a level higher than the other regions, it will complicate the fabrication steps and therefore increase cost.

As described above, double-layered polysilicon capacitive elements of the prior art have the problem of developing a depletion layer inherent to semiconductor electrodes, and a voltage dependency of the capacitance is unavoidable as long as semiconductor electrodes are used. While there are capacitive elements that employ metal layers for both electrodes, such a type makes it difficult to establish reliability and accuracy for the process of the device.

Accordingly, with an aim at eliminating the above-described problems of the prior art, it is an object of the present invention to provide a semiconductor capacitance device with considerably lower voltage dependency of capacitance, which device is made available without significantly altering the conventional fabrication process, and to provide semiconductor devices using the same.

DISCLOSURE OF THE INVENTION

According to one embodiment of the present invention, a semiconductor capacitance device comprises:

a first semiconductor capacitive element having a first voltage dependency factor K1;

a second semiconductor capacitive element having a second voltage dependency factor K2 with a gradient sign inverse of the first voltage dependency factor K1; and wiring layers connecting the first and second capacitive elements either in parallel or in series.

With a configuration such as described above, both the first semiconductor capacitive element and the second semiconductor capacitive element cancel out each other's voltage dependency characteristics to significantly reduce the voltage dependency of the total combined capacitance of the first and second semiconductor capacitive elements connected either in parallel or in series.

When, in the above described configuration, an effective area of the first semiconductor capacitive element is defined as S1, and that of the second semiconductor capacitive element as S2, and when $|K1|<|K2|$, it is preferable to set the relationship of the effective areas to S1>S2. Such an arrangement lowers the value of, for example, the voltage dependency factor for the total capacitance value in the case of a serial connection, i.e. $|K1 \cdot S1/(S1+S2)+K2 \cdot S2/(S1+S2)|$, thereby significantly reducing the voltage dependency of the total combined capacitance. Moreover, if in the above arrangement the value of the voltage dependency factor is set to be $|K1 \cdot S1/(S1+S2)+K2 \cdot S2/(S1+S2)|<100$ ppm/V, it could bring the voltage dependency of the total combined capacitance to an almost negligible level within the ranges of ordinary operating voltages and capacitance. In particular, if $|K1 \cdot S1| \approx |K2 \cdot S2|$ can be attained, then it provides $|K1 \cdot S1/(S1+S2)+K2 \cdot S2/(S1+S2)| \approx 0$, making the voltage dependency of the total combined capacitance practically negligible.

According to another embodiment, a semiconductor capacitance device of the present invention comprises:

a first capacitive element; and a second capacitive element connected to the first capacitive element either in parallel or in series, wherein the first capacitive element has a first electrode layer; and a second electrode layer comprising a semiconductor of a first conduction type and being arranged so that it faces the first electrode layer with an interposed dielectric layer, and wherein the second capacitive element has a third electrode layer; and a fourth electrode layer comprising a semiconductor of a second conduction type and being arranged so that it faces the first electrode layer with an interposed dielectric layer.

With a configuration such as described above, the voltage dependency factor of the first capacitive element is determined predominantly by the second electrode layer comprising the semiconductor of the first conduction type, whereas the voltage dependency factor of the second capacitive element is determined predominantly by the fourth electrode layer comprising the semiconductor of the second conduction type, making the gradient signs of the above two voltage dependency factors inverse to each other. Since the above establishes the same type of relationship between the first and second voltage dependency factors K1 and K2 as mentioned previously, voltage dependency of the total combined capacitance of the first and second capacitive elements connected either in parallel or in series could be significantly reduced.

In the above described configuration, the first electrode layer of the first capacitive element and the third electrode layer of the second capacitive element can be formed with an identical material in the same fabrication step. Such a method allows a concurrent fabrication of the first electrode layer of the first capacitive element and the third electrode layer of the second capacitive element with either the first or second conduction type.

Moreover, in the above configuration, it is preferable that the impurity concentration of the second electrode layer is set at a concentration lower than that of the first electrode layer, and that the impurity concentration of the fourth electrode layer is set at a concentration lower than that of the third electrode layer. This is because a depletion layer of a semiconductor electrode tends to have a wider spread within an electrode with a lower impurity concentration, which gives significant influence over the voltage dependency of the capacitance value. Accordingly, by using the second and fourth electrode layers comprising semiconductors of different conduction types with lower impurity concentrations, the plus or minus signs for the voltage dependency factors of the capacitance value could be set to differ with each other.

The first electrode layer and the third electrode layer could be formed as one contiguous electrode layer in a position facing the second electrode layer and the fourth electrode layer.

Additionally, the second electrode layer could be formed with a well of the first conduction type, and the fourth electrode layer could be formed with a well of the second conduction type. As an example for such an application, both the first and second capacitive elements could be MOS capacitors.

It is also possible to connect the semiconductor of the first conduction type constituting the second electrode layer of the first capacitive element and the semiconductor of the second conduction type constituting the fourth electrode layer of the second capacitive element using a semiconductor junction. Such an arrangement dispenses with the space between the second and fourth electrodes to improve the surface utilization efficiency of the device.

When the facing area between the first and second electrode layers of the first capacitive element is defined as S1, and that between the third and fourth electrode layers of the second capacitive element as S2, each areas of S1 and S2 could be arranged to differ from each other. In particular, in the case where there is a difference in the absolute values in voltage dependency factors between the first and second capacitive elements, changing the surface ratio S1/S2 is effective in contributing to the further reduction of the voltage dependency of the total combined capacitance.

With respect to the above-mentioned application, when the voltage dependency factor of the first capacitive element is defined as K1, and the voltage dependency factor of the second capacitive element as K2, the desirable relationships among S1, S2, K1, and K2 for further reducing the voltage dependency of the total combined capacitance are as described previously.

The semiconductor device of the present invention comprises a substrate on which the aforementioned semiconductor capacitance device is formed and at least one transistor formed on the substrate including a drain region, a source region, and a gate electrode.

With the semiconductor device and at least one transistor, various semiconductor circuits such as digital-analogue converters, integrators, and RC active filters, in which performance improvements could be provided by reducing the voltage dependency of the capacitance can be constituted.

In the above-mentioned application, it is preferable to form the second and fourth electrode layers of the semiconductor capacitance device and the gate electrode of the transistor together, using an identical material and in the same step. This method is preferred because it enables the formation of electrodes for the semiconductor capacitance device concurrently with a fabrication step for the transistor.

In the above-mentioned method, the first and the second semiconductor capacitance elements may be formed on the field oxide layer of at least one transistor.

In the event that the second electrode layer of the first capacitive element comprises a semiconductor of a first conduction type, such a second electrode layer may be implanted with impurity ions using the same step for implanting ions into the well region of the first conduction type of at least one transistor.

Alternatively, when the fourth electrode layer of the second capacitive element comprises a semiconductor of a second conduction type, such a fourth electrode layer may be implanted with impurity ions using the same step for implanting ions into the well region of the second conduction type of at least one transistor.

Moreover, in applications such as a dual gate CMOS or the like, implants with desired ions into the second and forth electrode layers may be performed by using ion implanting steps for each of the source or drain regions of PMOS as well as NMOS components.

BEST MODE FOR CARRYING OUT THE INVENTION (First Embodiment)

Figure 1:
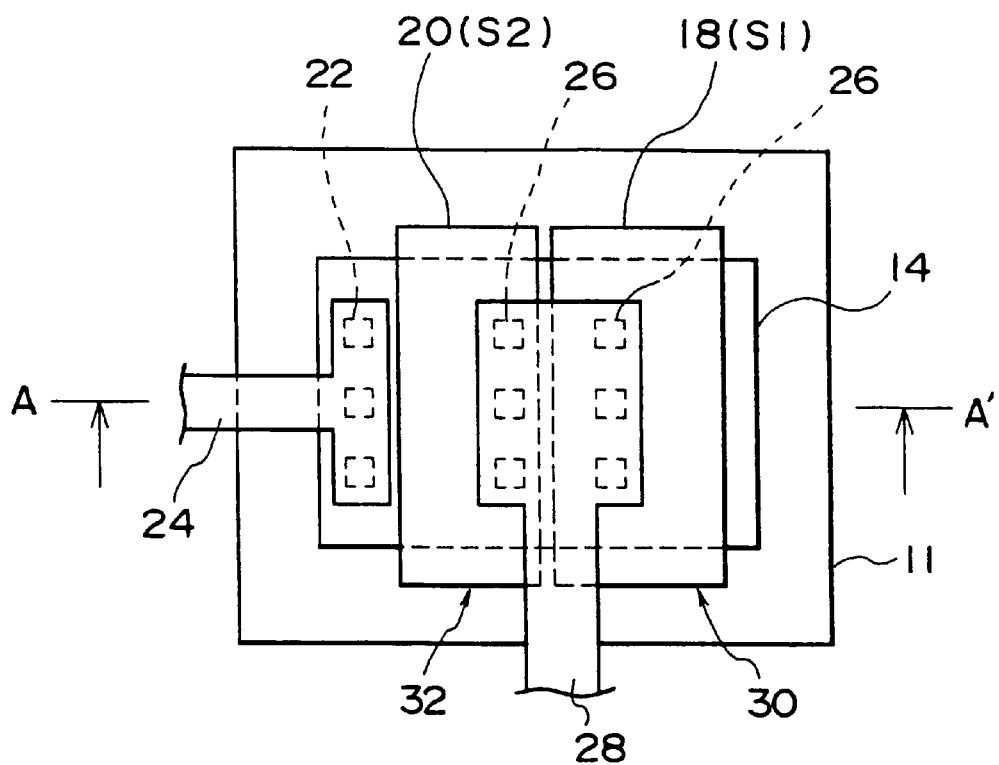
FIG. 1 is a schematic plan view illustrating a semiconductor capacitance device in the first embodiment of the present invention.
Figure 2:
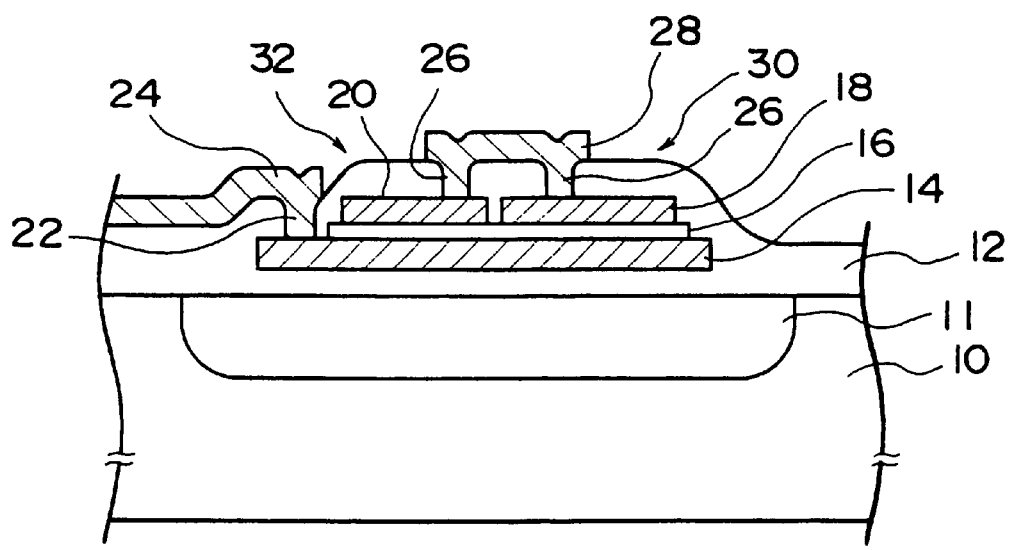
FIG. 2 is a cross-sectional view through the A–A' plane of FIG. 1.

FIGS. 1 and 2 illustrate a semiconductor capacitance device in the first embodiment of the present invention. FIG. 1 is a schematic plan view of the semiconductor capacitance device, whereas FIG. 2 is a cross-sectional view through the A–A' plane of FIG. 1.

As shown in FIGS. 1 and 2, to provide for both the first and third electrode layers of the present invention, a first doped polysilicon layer 14, for example, is formed on a semiconductor substrate 10 with a dielectric layer 12 interposing. On top of the first doped polysilicon layer 14, a second doped polysilicon layer 18, for example, as the second electrode layer of the present invention and a third doped polysilicon layer 20 as the fourth electrode layer of the present invention are formed with a dielectric layer 16 interposing them and the doped polysilicon layer 14.

The first doped polysilicon layer 14, the dielectric layer 16, and the second doped polysilicon layer 18 form the first capacitive element 30. Also, the first doped polysilicon layer 14, the dielectric layer 16, and the third doped polysilicon layer 20 form the second capacitive element 32.

Note that the area denoted with symbol 11 indicates a well generally used for shielding the capacitive element from electrical noises propagated from the semiconductor substrate 10. Further, the first doped polysilicon layer 14 is connected to a first wiring layer 24 embedded in a contact hole 22. In the meantime, the second and third doped polysilicon layers, 18 and 20, are each connected to a second wiring layer 28 embedded in a contact hole 26.

Figure 3:
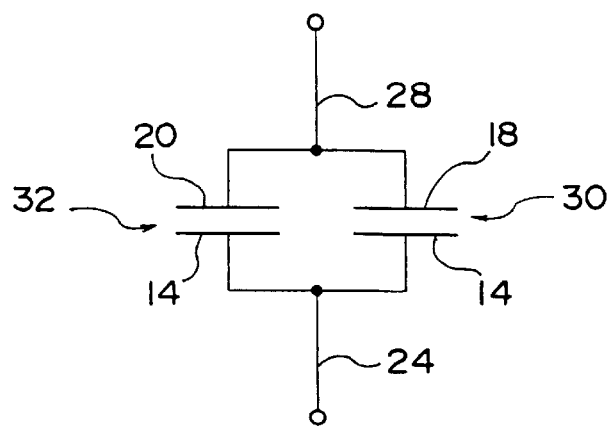
FIG. 3 is an equivalent circuit diagram of the semiconductor capacitance device shown in FIGS. 1 and 2.

The first and second capacitive elements 30 and 32 are thus connected in parallel as shown in FIG. 3.

In the above configuration, the first doped polysilicon layer 14 to be commonly used in the aforementioned first and second capacitive elements 30 and 32 typically comprises an N-type semiconductor having a relatively higher impurity concentration in comparison with the second and third doped polysilicon layers 18 and 20. The second doped polysilicon layer 18 of the first capacitive element 30 comprises a semiconductor of the same N-type conduction type but a lower impurity concentration than the first doped polysilicon layer 14. Meanwhile, the third doped polysilicon layer 20 of the second capacitive element 32 comprises a P-type semiconductor with an opposite conduction type and an impurity concentration lower than the first doped polysilicon layer 14.

Figure 4:
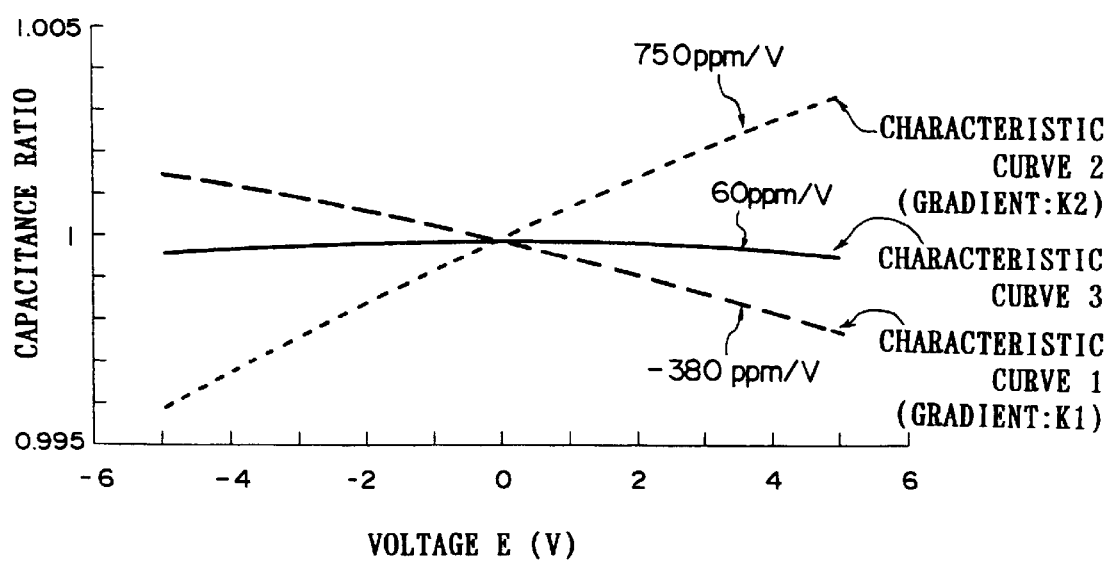
FIG. 4 is a graph showing the voltage dependency of the capacitance of the semiconductor capacitance device in the first embodiment of the present invention.

With the above arrangements, as illustrated in FIG. 4, the characteristic curve 1, indicating the voltage dependency characteristics of the first capacitive element 30, and the characteristic curve 2, indicating the voltage dependency characteristics of the second capacitive element 32, have opposite directions of the slope, i.e. each of the gradients (the voltage dependency factors K1 and K2 of the capacitance, to be described later) has a sign of either plus or minus inverse to each other. The rationale behind the aforementioned arrangement is provided in the following sections.

Figure 5:
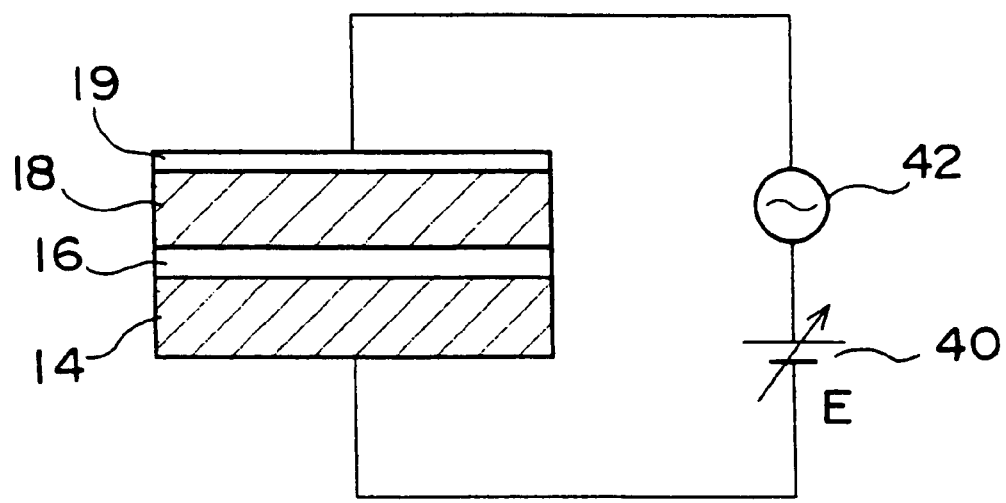
FIG. 5 is a schematic diagram of an experimental apparatus used to measure the characteristic curve 1 shown in FIG. 4.
Figure 6:
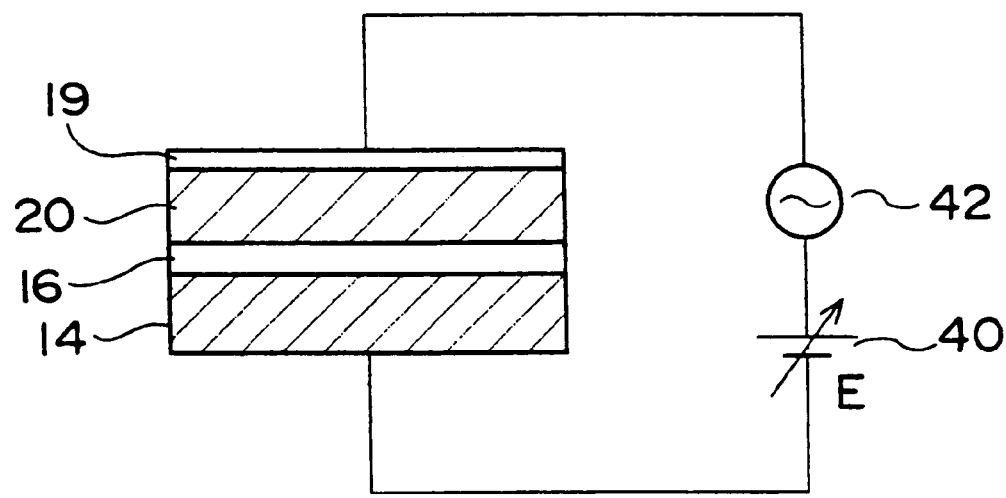
FIG. 6 is a schematic diagram of an experimental apparatus used to measure the characteristic curve 2 shown in FIG. 4.

FIGS. 5 and 6 schematically show the source voltage apparatuses used for applying voltage to the first and second capacitive elements 30 and 32, to measure and obtain the characteristic curves 1 and 2. The apparatuses shown in FIGS. 5 and 6 both have a direct-current power source 40 for applying variable bias voltages and an alternating-current power source 42 for generating alternating current signals to be overlaid on the direct-current bias voltages. Note that a WSi layer 19 is formed on the second doped polysilicon layer 18 of both devices.

When the direct-current voltage E (at E>0) applied on the first capacitive element 30 shown in FIG. 5 is raised, an electron depletion occurs in the upper layer of the second doped polysilicon layer 18 on the surface that is in contact with the dielectric layer 16, to directionally widen the effective interelectrode distance of the first capacitive element 30. On the other hand, in the lower, first doped polysilicon layer 14, an increase in the direct-current voltage E causes an electron accumulation on the surface in contact with the dielectric layer 16 to directionally narrow the effective interelectrode distance of the first capacitive element 30. When the direct-current voltage E is negative, the effects occurring in the doped polysilicon layers 14 and 18 shift the effective interelectrode distance toward directions opposite to the aforementioned directions.

Meanwhile, the voltage dependency of capacitance tends to become more pronounced when the impurity concentration is lower. In the present embodiment, since the impurity concentration of the second doped polysilicon layer 18 is set to be lower than that of the first doped polysilicon layer 14, the second doped polysilicon layer 18 predominantly determines the voltage dependency of the capacitance value. As a result, when direct-current voltage E>0, the effective interelectrode distance of the first capacitive element 30 widens as the absolute voltage value increases; when direct-current voltage E<0, the effective interelectrode distance of the first capacitive element 30 narrows as the absolute voltage value increases.

Accordingly, as indicated by the characteristic curve 1 of FIG. 4, the voltage dependency characteristics exhibited are such that the capacitance value reduces with an increasing value of voltage E applied to the first capacitive element 30 when E>0, but increases with a higher absolute value of voltage E applied to the first capacitive element 30 when E<0.

In the second capacitive element 32, an increase in the direct-current voltage E (at E>0) causes an electron accumulation in the third doped polysilicon layer 20, which predominantly determines the voltage dependency, on the surface that is in contact with the dielectric layer 16 to directionally narrow the effective interelectrode distance of the second capacitive element 32. Conversely, when the absolute value of the direct-current voltage E (at E<0) applied is increased, an electron depletion occurs on the surface that is in contact with the dielectric layer 16 to directionally widen the effective interelectrode distance of the second capacitive element 32.

Accordingly, as indicated by the characteristic curve 2 of FIG. 4, the voltage dependency characteristics exhibited are such that the capacitance value increases if an increasing value of voltage E is applied to the first capacitive element 30 when E>0, but decreases if a higher absolute value of voltage E is applied to the first capacitive element 30 when E<0.

While the characteristic curves 1 and 2 illustrated in FIG. 4 appear as roughly inverted mirror images, the voltage dependency of the characteristic curve 1 according to an experiment with the present embodiment was −380 ppm/V, and the voltage dependency of the characteristic curve 2 was 750 ppm/V.

Now, supposing the direct-current voltage E is in a positive range, the capacitance value of the first capacitive element 30 at a direct-current bias voltage of 0 could be defined as C1, with a voltage dependent variate of the capacitance value as −ΔC1. Similarly, the capacitance value of the second capacitive element 32 at a direct-current bias voltage of 0 could be defined as C2, with a voltage dependent variate of the capacitance value as +ΔC2.

It should be noted here that the first and second capacitive elements, 30 and 32, with inverted signs for the voltage dependent variates of the capacitance value are connected in parallel in the present embodiment.

Therefore, the total combined capacitance of the first and second capacitive elements, 30 and 32, can be expressed as follows:

$$C=C1+C2+(-\Delta C1+\Delta C2) \quad (1)$$

It is therefore clear in the above that the voltage dependent variates of the capacitance bracketed in the last item cancel out each other to reduce the voltage dependency of the total combined capacitance. In the case of the present embodiment, the voltage dependency of the total combined capacitance is indicated by the characteristic curve 3 as shown in FIG. 4. It can be seen from the graph that the characteristic curve 3 demonstrates that the voltage dependency has been successfully reduced to ±60 ppm/V within the range of −5V<E<+5V.

It is also possible to bring the voltage dependency characteristics of the capacitance by the two capacitive elements 30 and 32 to a value infinitely close to zero. This can be accomplished by optimizing the facing area (effective area) S1, between the first doped polysilicon layer 14 and the second doped polysilicon layer 18, and the facing area S2, between the first doped polysilicon layer 14 and the third doped polysilicon layer 20, in proportion to the respective voltage dependency factors K1 and K2 for the first and second capacitive elements.

With respect to the above configuration, two related variables are newly defined with symbols as follows:

$C_{on}$: Capacitance per unit area of oxide layer on the first capacitive element 30

$C_{op}$: Capacitance per unit area of oxide layer on the second capacitive element 32

Using the above variables, the total combined capacitance of the first and second capacitive elements, i.e. 30 and 32 connected in parallel, can be expressed as follows:

$$C=C1+C2=C_{on}(1+K1\cdot E)\times S1+C_{op}(1+K2\cdot E)\times S2 \quad (2)$$

If it is deemed that $C_{on}=C_{op}=C_o$ to simplify the above equation, then $$C=C1+C2=C_o[S1+S2+(K1\cdot S1+K2\cdot S2)E]=C_o(S1+S2)\times[1+E\{K1\cdot S1/(S1+S2)+K2\cdot S2/(S1+S2)\}]$$

In the meantime, the gradient of the voltage dependency factor K1 corresponds with the characteristic curve 1 in FIG. 4, and K1<0 in the present embodiment, whereas the gradient of the voltage dependency factor K2 corresponds with the characteristic curve 2 in FIG. 4, and K2>0 in the present embodiment.

While the equation (3) and the equation (1) define the same total combined capacitance, there are the following relationships between the elements in the equations (1) and (2):

$$-\Delta C1=C_o\cdot K1\cdot S1\cdot E$$

$$+\Delta C2=C_o\cdot K2\cdot S2\cdot E$$

Thus, K1·S1 and K2·S2 are inverse to each other. Therefore, as with the equation (1), it is also evident from the equation (3) that the total combined capacitance has a low voltage dependency.

Moreover, the equation (3) indicates that a further reduction of the voltage dependency of the total combined capacitance could be accomplished by bringing the value of |K1·S1/(S1+S2)+K2·S2/(S1+S2)| as close to zero as possible.

The above is evident because if |K1·S1/(S1+S2)+K2·S2/(S1+S2)|≈0, or |K1·S1|≈|K2·S2| can be attained, then it renders the equation (3) to be C≈$C_o$ (S1+S2), indicating that the total combined capacitance C is virtually independent of the voltage E.

In fact, as shown in FIGS. 1 and 2, since |K1|<|K2| in this first embodiment, it has been attempted to achieve S1>S2 so that |K1·S1/(S1+S2)+K2·S2/(S1+S2)| could be brought closer to zero. In such an endeavor, high accuracy is ensured in controlling the surface ratio S1/S2, since it is supported by the precision of masking and etching steps in patterning the second and third doped polysilicon layers 18 and 20.

In practical applications, if |K1·S1/(S1+S2)+K2·S2/(S1+S2)|<100ppm/V could be attained within the range of −5V<E<+5V, then the voltage dependency of the total combined capacitance becomes practically negligible. This can be verified by applying the ordinary capacitance values of 0.1 fF/$\mu m^2$<$C_o$<1.0 fF/$\mu m^2$ to the equation (3), which gives the possible values of the voltage dependent capacitance variate, i.e. $C_o$·[K1·S1/(S1+S2)+K2·S2/(S1+S2)]·E, to be within the range of −500×$10^6$ fF/$\mu m^2$<$C_o$[K1·S1/(S1+S2)+K2·S2/(S1+S2)]·E<500×$10^6$ fF/$\mu m^2$, which is virtually negligible.

(Second Embodiment)

Figure 7:
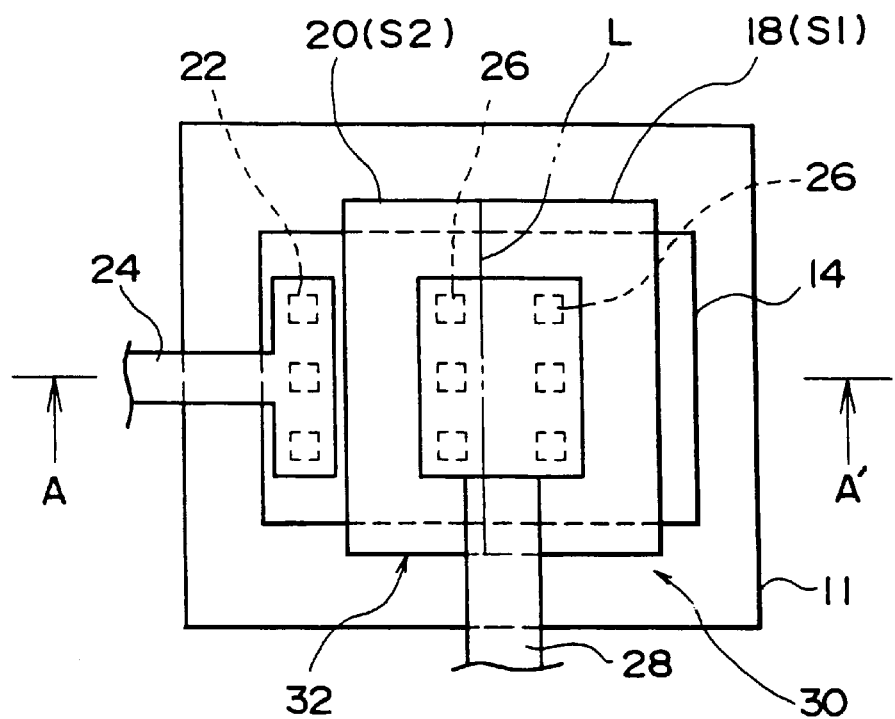
FIG. 7 is a schematic plan view illustrating a semiconductor capacitance device in the second embodiment of the present invention.
Figure 8:
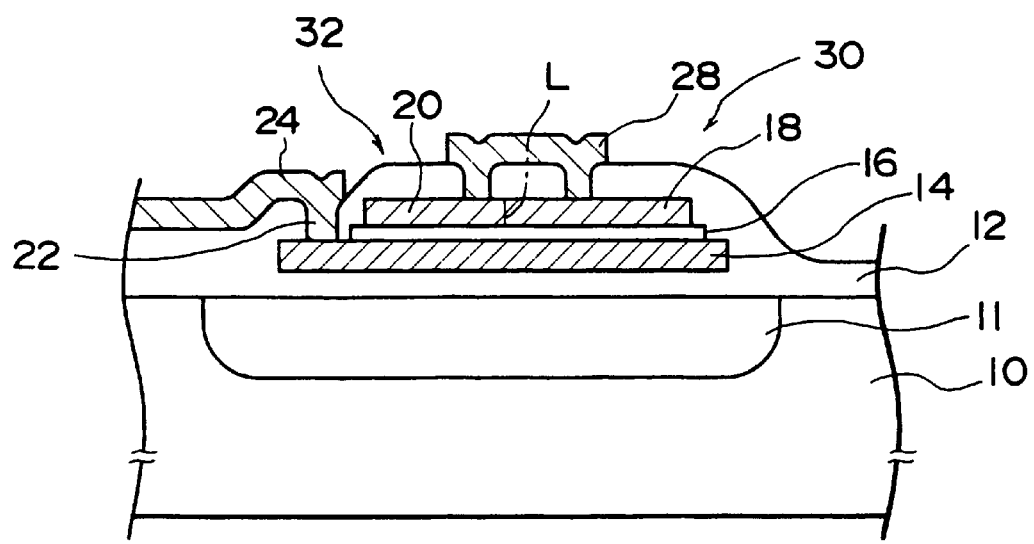
FIG. 8 is a cross-sectional view through the A–A' plane of FIG. 7.

Next, the second embodiment of the present invention is illustrated in FIGS. 7 and 8. FIG. 8 is a cross-sectional view through the A–A' plane of FIG. 7. In the present embodiment, the second doped polysilicon layer 18 of the first capacitive element 30 and the third doped polysilicon layer 20 of the second capacitive element 32 are connected with a semiconductor junction, rather than set apart as in the first embodiment. Other configurations of the second embodiment are the same as in the first embodiment. Note that a metallic wiring 24 brings the second doped polysilicon layer 18 and the third doped polysilicon layer 20 electrically equipotential.

According to the second embodiment, the surface utilization efficiency of the device could be improved over the first embodiment, since it does not require even the minimum space between the second doped polysilicon layer 18 and the third doped polysilicon layer 20 as determined by the design rule. However, due to the diffusion of impurities occurring at the boundary L between the second doped polysilicon layer 18 and the third doped polysilicon layer 20, the accuracy in controlling the surface ratio S1/S2 is inferior to that of the first embodiment.

(Third Embodiment)

Figure 9:
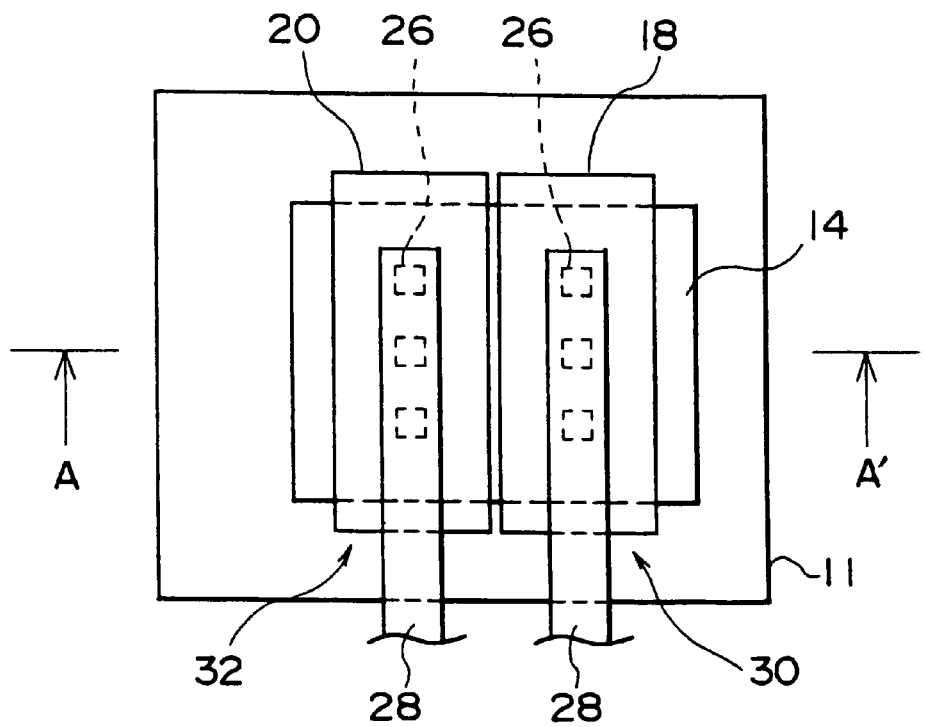
FIG. 9 is a schematic plan view illustrating a semiconductor capacitance device in the third embodiment of the present invention.
Figure 10:
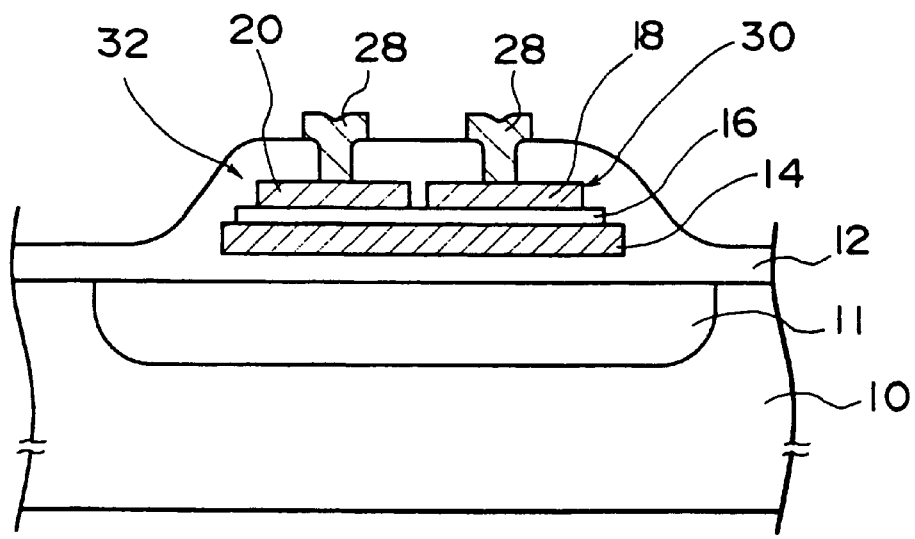
FIG. 10 is a cross-sectional view through the A–A' plane of FIG. 9.
Figure 11:
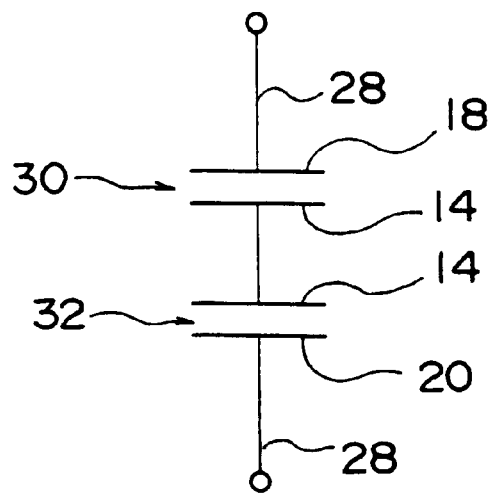
FIG. 11 is an equivalent circuit diagram of the semiconductor capacitance device shown in FIGS. 9 and 10.

FIG. 9 shows the third embodiment of the present invention. A cross-sectional view through A–A' plane of FIG. 9 is shown in FIG. 10. The difference this third embodiment has in relation to the first embodiment is that it serially connects the first capacitive element 30 and the second capacitive element 32, with a resulting equivalent circuit diagram given in FIG. 11.

In the above configuration, the total combined capacitance C is expressed as $C=C1 \cdot C2/(C1+C2)$. By arranging the device in conditions similar to those in the first embodiment, the voltage dependency of the total combined capacitance C could be significantly reduced. It should be noted here that in case of a serial connection the total combined capacitance C becomes one half that of the first embodiment, supposing C1=C2. To secure the same total combined capacitance size therefore requires that the area size of S1 and S2 be doubled from that of the corresponding size in the first embodiment.

(Fourth Embodiment)

Figure 12:
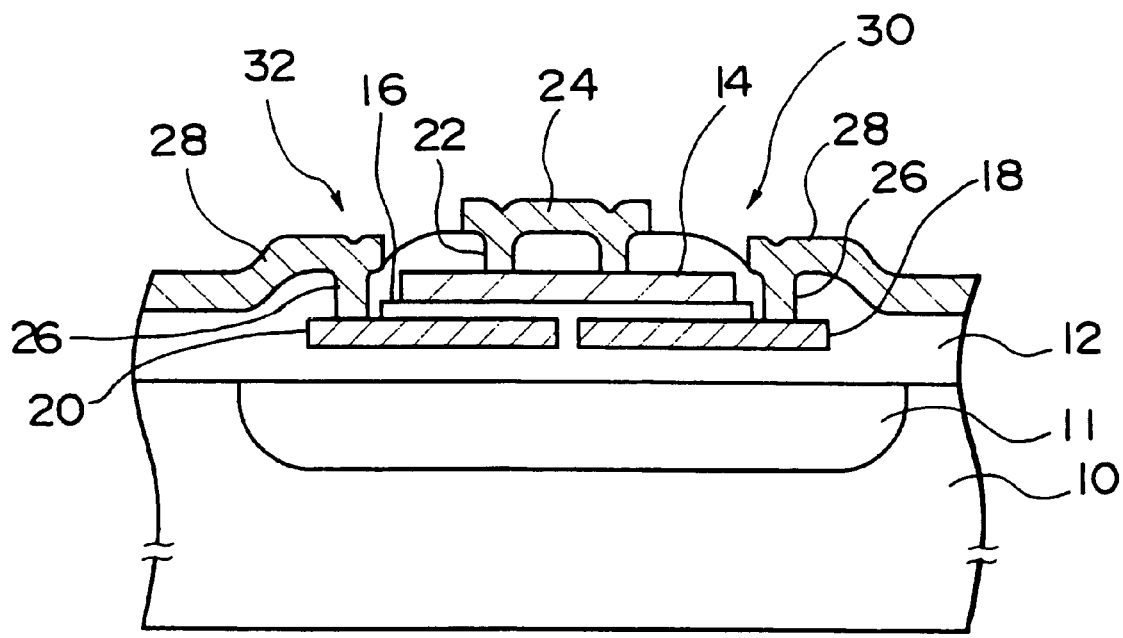
FIG. 12 is a schematic plan view illustrating a semiconductor capacitance device in the fourth embodiment of the present invention.

FIG. 12 shows the fourth embodiment of the present invention. In the example illustrated in FIG. 12, the first doped polysilicon layer 14 is placed on top of the second and third doped polysilicon layers 18 and 20, with the dielectric layer 16 interposed in between. The second and third doped polysilicon layers 18 and 20 in this embodiment may be connected with a semiconductor junction in a manner similar to the second embodiment.

While the configuration in the fourth embodiment is suited for a serial connection from a wiring point of view, a parallel connection could be provided if the second and third doped polysilicon layer 18 and 20 are electrically connected.

(Fifth Embodiment)

Figure 13:
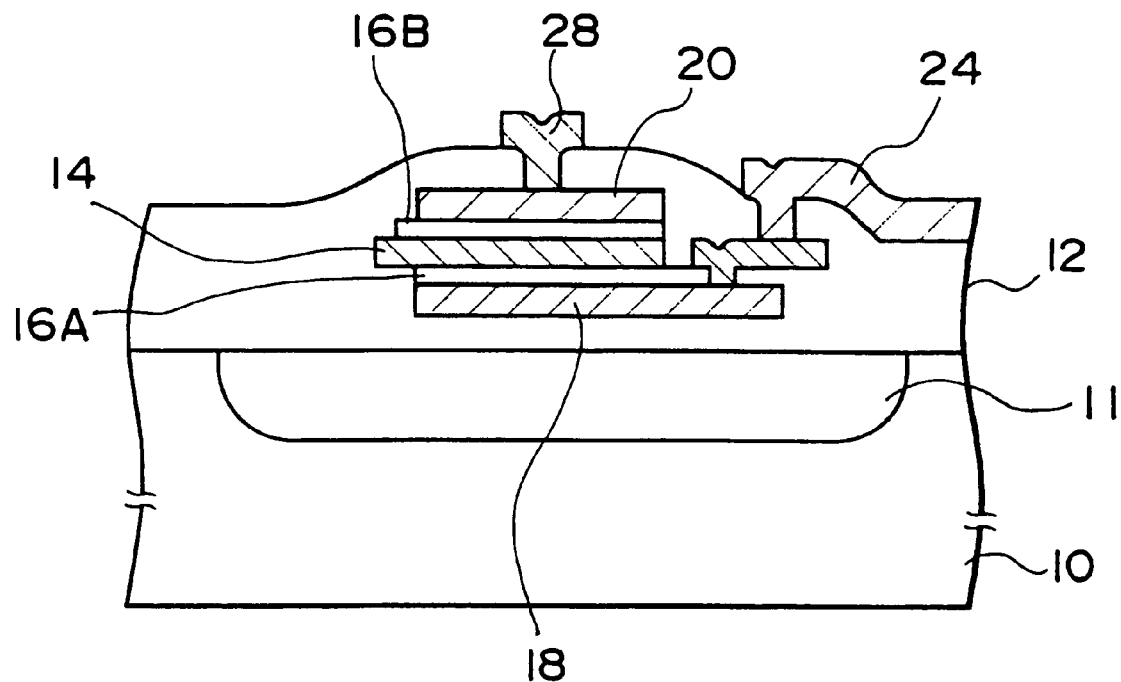
FIG. 13 is a schematic plan view illustrating a semiconductor capacitance device in the fifth embodiment of the present invention.

FIG. 13 shows the fifth embodiment of the present invention. In the example illustrated in FIG. 13, the first doped polysilicon layer 14 is placed on top of the second doped polysilicon layer 18 with the first dielectric layer 16A interposed. Further, the third doped polysilicon layer 20 is placed on top of the first doped polysilicon layer 14 with the second dielectric layer 16B interposed. While FIG. 13 gives an example of the first and second capacitive elements 30 and 32 connected in parallel, they may also be connected in series.

In particular, since this fifth embodiment does not require the second and the third doped polysilicon layers to be arranged side by side in the same plane, it improves the surface utilization efficiency of the device. Therefore, even if the first and second capacitive elements 30 and 32 are connected in series and yet the same total combined capacitance as in a parallel connection setup has to be secured, an additional area such as required in the third embodiment is not necessary.

(Sixth Embodiment)

In the following, the sixth embodiment of the present invention will be described referring to FIG. 14 through FIG. 20, which are cross-sectional views illustrating the main steps of fabricating a semiconductor device of the present invention.

Figure 14:
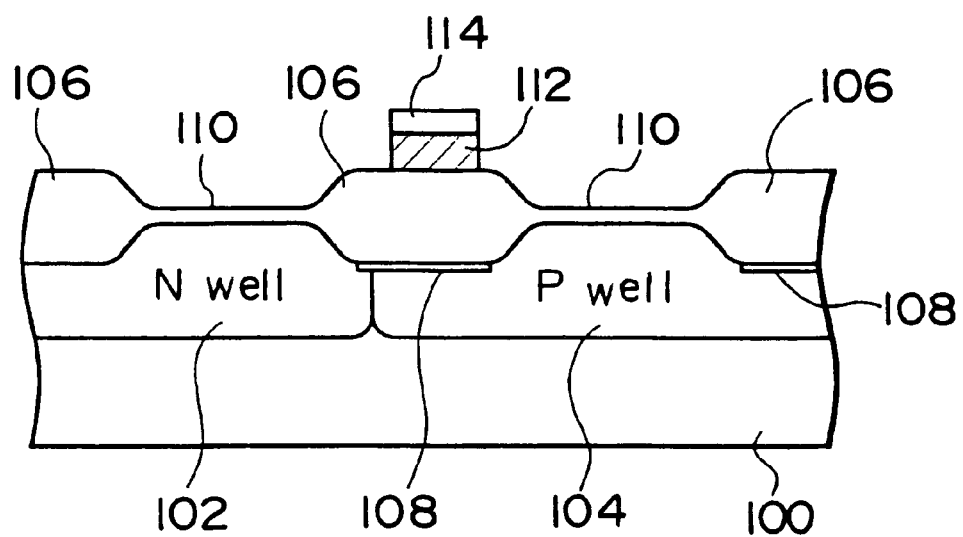
FIG. 14 is a cross-sectional view illustrating the first step of a semiconductor device in the sixth embodiment of the present invention.

First, as shown in FIG. 14, an N-well 102 and a P-well 104 are formed, for example, on an N-type silicon substrate 100.

Next, an isolation step is performed using the LOCOS (Local Oxidation of Silicon) technique. As a result of the above isolation step, a field oxide layer 106 for isolating elements is grown typically to a thickness of 6000 to 8000 Å, as shown in FIG. 14. Also in the above isolation step, a channel stop layer 108 is formed by injecting channel stopping ions such as boron into the P-well 104.

Following the completion of the elements isolation step, steps of fabricating transistors are taken place whereby the semiconductor capacitance device of interest is concurrently fabricated utilizing the same steps.

For the above purpose, a gate oxide layer 110 is formed typically to a thickness of 50 to 200 Å, as shown in FIG. 14.

Meanwhile, a first polysilicon layer 112 is formed over the field oxide layer 106, as shown in FIG. 14. Further, an interlayer dielectric 114 is formed on the first polysilicon layer 112. The interlayer dielectric 114 may comprise either a single layer or multiple layers. In the present embodiment, for example, the dielectric interlayer 114 is composed of an $SiO_2$ layer having a thickness of 50 to 200 Å that is formed in the same step with the gate oxide layer, an $SiN_x$ layer with a thickness of 100 to 300 Å, and an $SiO_2$ layer having a thickness of 50 to 200 Å.

Figure 15:
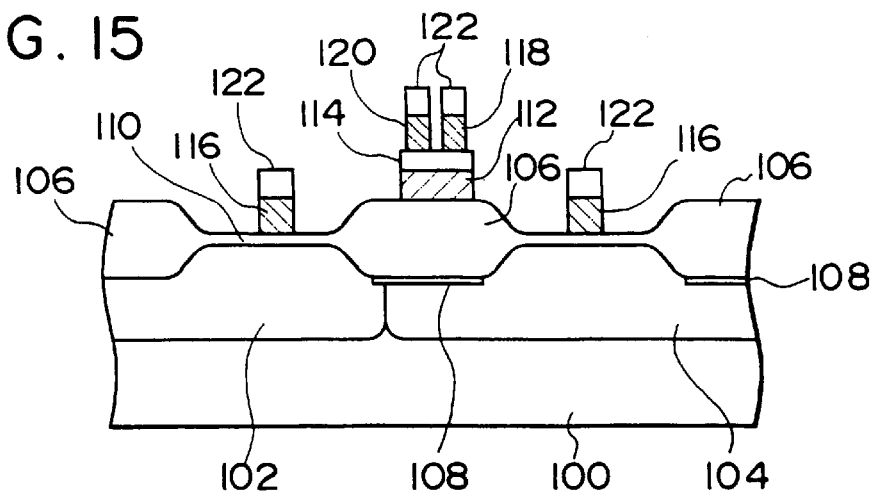
FIG. 15 is a cross-sectional view illustrating the second step of the semiconductor device in the sixth embodiment of the present invention.

Next, a gate electrode 116 is formed with polysilicon, as shown in FIG. 15. Making use of the steps for forming the gate electrode 116, a second and a third polysilicon layers 118 and 120 are provided on top of the dielectric interlayer 114. The gate electrode as well as the second and third polysilicon layers 118 and 120 are concurrently patterned using a resist layer 122.

Figure 16:
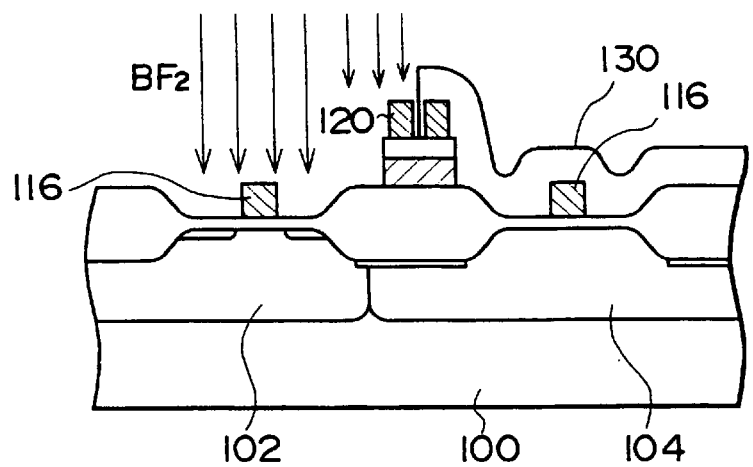
FIG. 16 is a cross-sectional view illustrating the third step of the semiconductor device in the sixth embodiment of the present invention.
Figure 17:
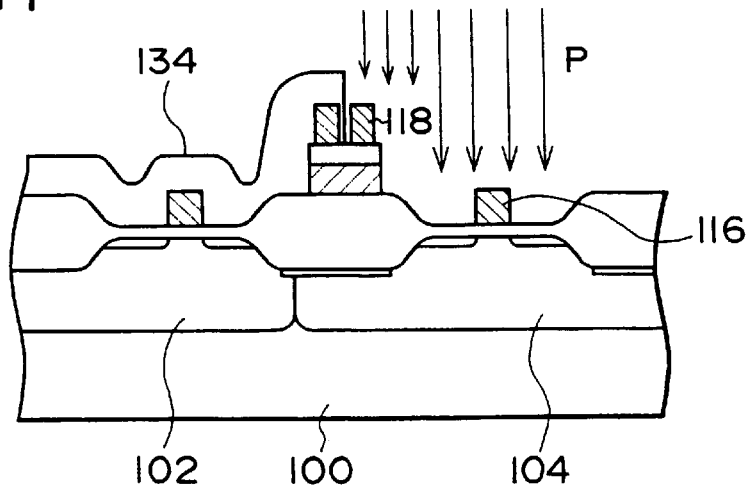
FIG. 17 is a cross-sectional view illustrating the fourth step of the semiconductor device in the sixth embodiment of the present invention.
Figure 19:
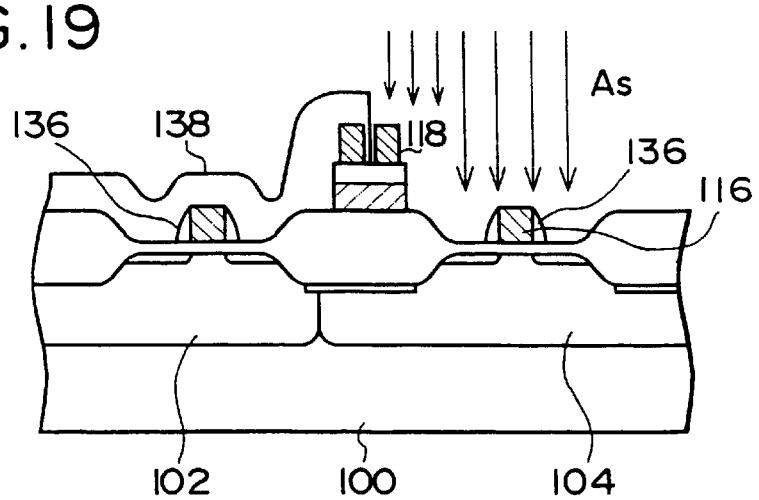
FIG. 19 is a cross-sectional view illustrating the sixth step of the semiconductor device in the sixth embodiment of the present invention.
Figure 20:
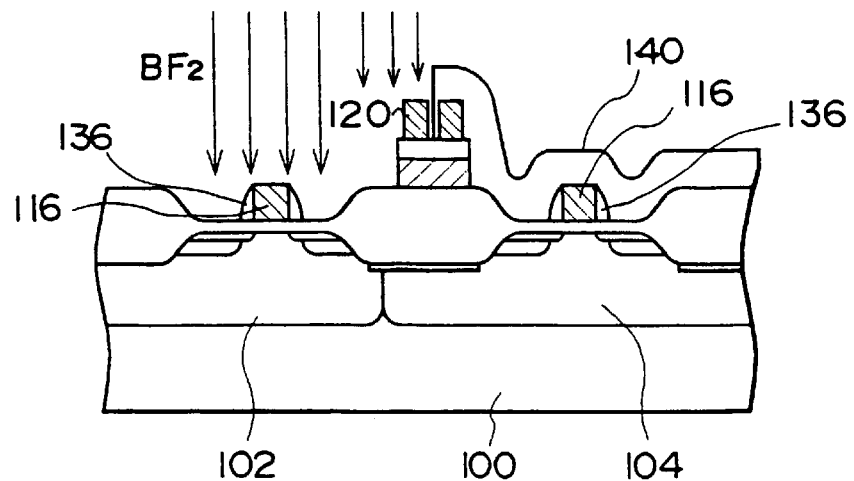
FIG. 20 is a cross-sectional view illustrating the seventh step of the semiconductor device in the sixth embodiment of the present invention.

After removing the resist layer 122, an ion-implanting step is performed. FIGS. 16 and 17 show a low concentration ion-implanting step, whereas FIGS. 19 and 20 show a high concentration ion-implanting step. Note that the steps described below belong to a manufacturing process of a so-called Dual-gate CMOS in which the types of semiconductors used for the gate electrode 116 differ between PMOS and NMOS.

First, in preparation for the low concentration ion implant into the N-well 102, the region above the P-well 104 is covered by the first mask 130, as shown in FIG. 16. Subsequently, an injection, for example, of $BF_2$ provides a low concentration impurity implant into a self-aligned region on the surface of the N-well 102, except for the area underneath the gate electrode 116.

Next, in preparation for the low concentration ion implant into the P-well 104, the region above the N-well 102 is covered by the second mask 134, as shown in FIG. 17. Then an injection, for example, of phosphorus is performed to provide a low concentration implant into a self-aligned region on the surface of the P-well 104, except for the area underneath the gate electrode 116.

The low concentration ion implants such as described above, are performed to establish an LDD (Lightly Doped Drain) structure.

Figure 18:
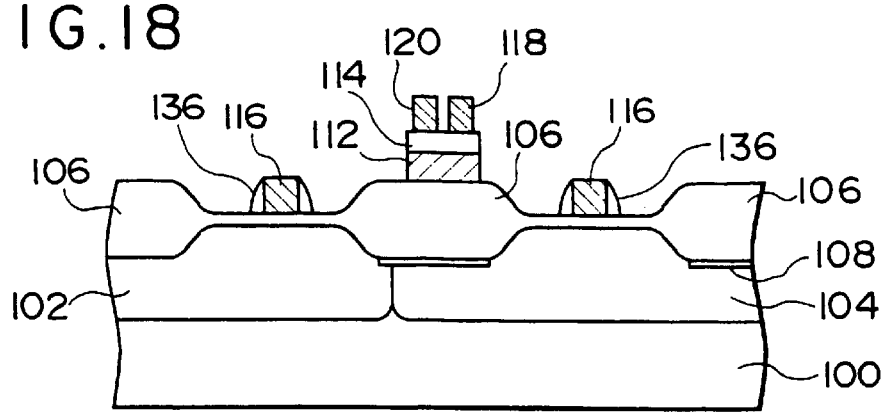
FIG. 18 is a cross-sectional view illustrating the fifth step of the semiconductor device in the sixth embodiment of the present invention.

Subsequently, as shown in FIG. 18, a sidewall layer 136, comprising a material such as $SiO_2$, is formed on the side of the gate electrode 116. The sidewall layer 116 is prepared by using a CVD (Chemical Vapor Deposition) method and an etch-back method.

Next, in preparation for the high concentration ion implant into the P-well 104, the region above the N-well 102 is covered by the third mask 138, as shown in FIG. 19. Then As is injected at a high concentration (e.g. from $1 \times 10^{15}$ to $10 \times 10^{15}/cm^2$). This provides a high concentration impurity implant into an area self-aligned to the gate electrode with the sidewall layer 136, in the region deeper than that of the low concentration impurity in the P-well 104, except for the area underneath the gate electrode 116 and the sidewall layer 136.

The above high concentration ions are implanted not only into the source and drain regions of the NMOS, but also into the gate electrode 116 of the NMOS and the second polysilicon layer 118 corresponding to the upper electrode of the first capacitive element 30 that is described in the first embodiment. Thus the second polysilicon layer 118 after the above ion implant provides an equivalent of the second doped polysilicon layer 18 as described in the first embodiment.

Furthermore, in preparation for the high concentration ion implant into the N-well 102, the region above the P-well 104 is covered by the fourth mask 140, as shown in FIG. 20. Then a high concentration (e.g. $1 \times 10^{15}$ to $10 \times 10^{15}/cm^2$) $BF_2$ is injected. At this time, self-aligned to the gate electrode 116 with the sidewall layer 136, a high concentration impurities are injected in the region deeper than the low concentration impurity region of the N-well 102, except for the area underneath the gate electrode 116 and the sidewall layer 136.

The above high concentration ions are implanted not only into the source and drain regions of the PMOS, but also into the gate electrode 116 of the PMOS as well as the third polysilicon layer 120 that is corresponding to the upper electrode of the second capacitive element 32 described in the first embodiment. Thus the third polysilicon layer 120 after the above ion implant provides an equivalent of the third doped polysilicon layer 20 as described in the first embodiment.

As described in the foregoing, in accordance with the fifth embodiment of the present invention, a semiconductor capacitance device could be fabricated by utilizing the ion implantation steps that are indispensable in the manufacturing process of a Dual-gate CMOS.

(Seventh Embodiment)

Figure 21:
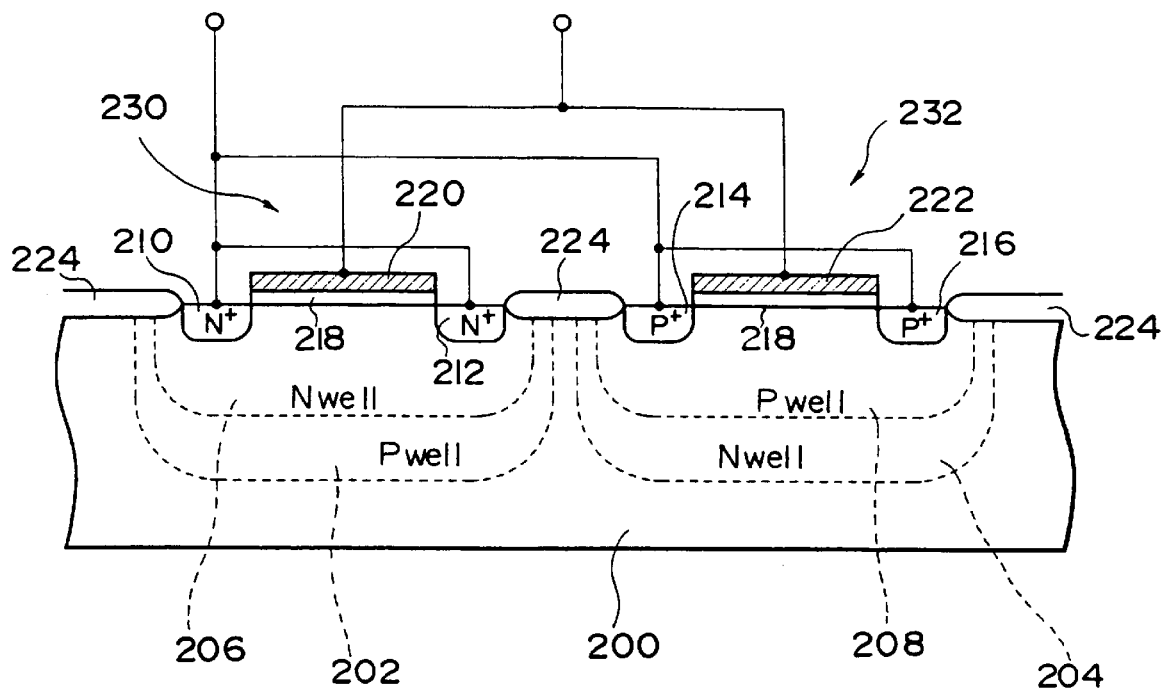
FIG. 21 is a schematic cross-sectional view illustrating a semiconductor capacitance device in the seventh embodiment of the present invention.

The seventh embodiment of the present invention is shown in FIG. 21. FIG. 21 illustrates an embodiment configuring a semiconductor capacitance device of the present invention with MOS capacitors. As shown in FIG. 21, in the deeper regions of a silicon substrate 200 a P-well 202 and an N-well 201 are formed. The P-well 202 is connected to a power source Vss, and the N-well 204 to a power source Vdd. Additionally, an N-well 206 is formed in a shallower region than the P-well 202, and a P-well 208 is formed in a shallower region than the N-well 204. Note that the P-well 202 and the N-well 204 are prepared with an aim to make the potential of the N-well 206 and the P-well 208 different from that of the substrate, and therefore are unnecessary if such a requirement does not exist.

Further, in the N-well 206 of the silicon substrate 200 an N $^+$source 210 and an N$^+$ drain 212 are formed; and also a P$^+$ source 214 and a P$^+$ drain 216 are formed in the P-well 208.

Additionally, over the channel region of the N-well 206 and an interposed gate oxide layer 218 a gate electrode 220 comprising an N$^+$ polysilicon layer is formed. Connecting the source 210 and the drain 212 configures the first MOS capacitor 230.

Similarly, over the channel region in the P-well 208 and an interposed gate oxide layer 218 a gate electrode 222 comprising an N$^+$ polysilicon layer is formed. Connecting the source 214 and the drain 216 configures the second MOS capacitor 232. In between the two MOS capacitors 230 and 232 a field oxide layer 224 for isolating the elements is formed.

By connecting the gate electrodes 220 and 222 of the first and second MOS capacitors 230 and 232, and also connecting the sources 210 and 214 with the drains 212 and 216, the first and second MOS capacitors 230 and 232 are connected in parallel.

The above MOS capacitors 230 and 232 could be fabricated by utilizing the manufacturing process for a single gate MOS transistor.

(Eighth Embodiment)

Figure 22:
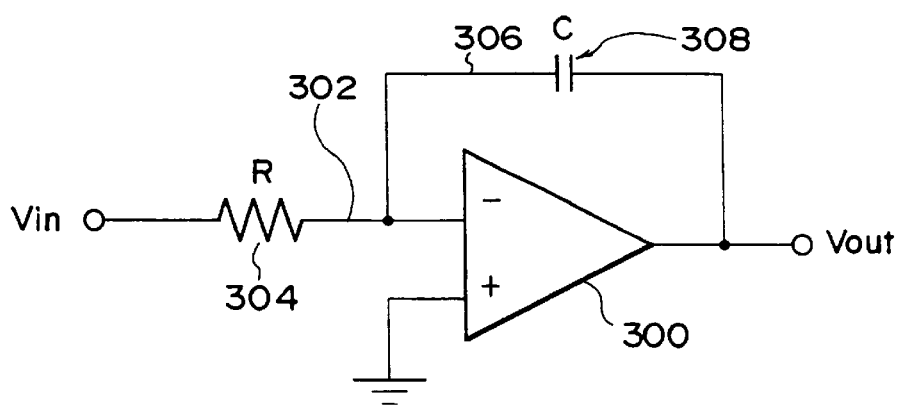
FIG. 22 is a circuit diagram showing a semiconductor device in the eighth embodiment of the present invention.
Figure 23:
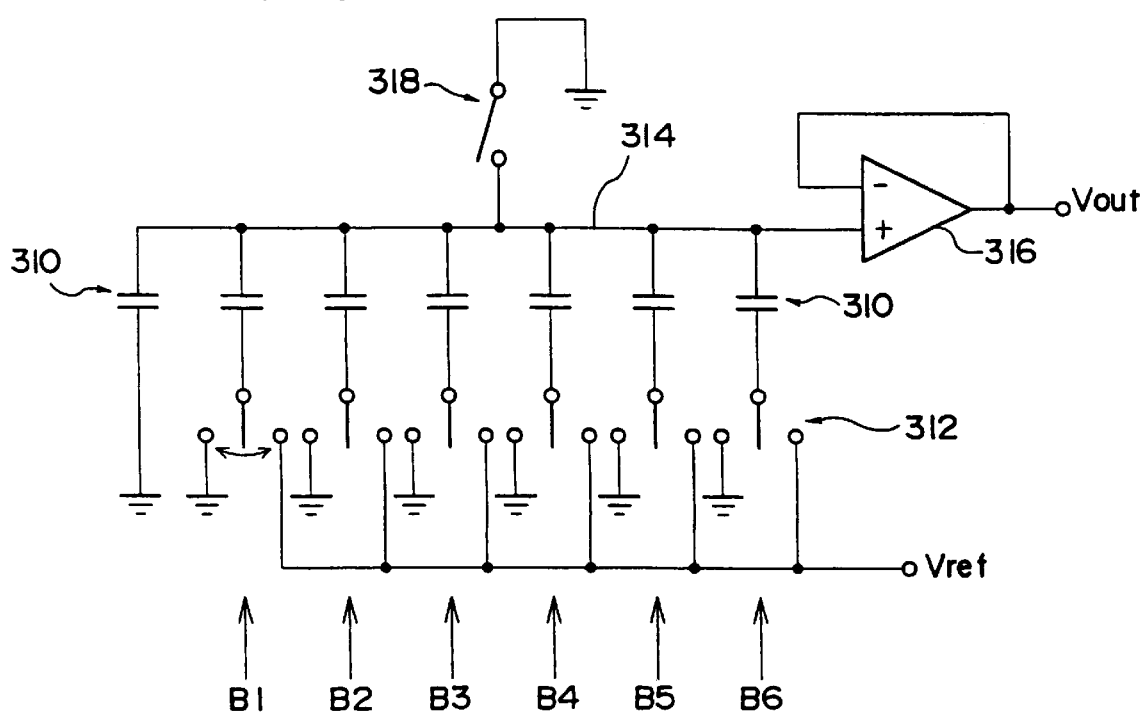
FIG. 23 is another circuit diagram showing the semiconductor device in the eighth embodiment of the present invention.
Figure 24:
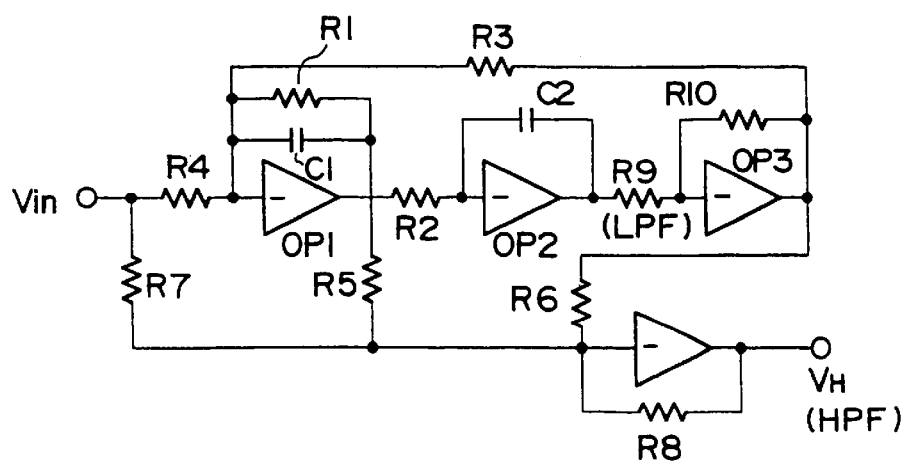
FIG. 24 is yet another circuit diagram showing the semiconductor device in the eighth embodiment of the present invention.
Figure 25:
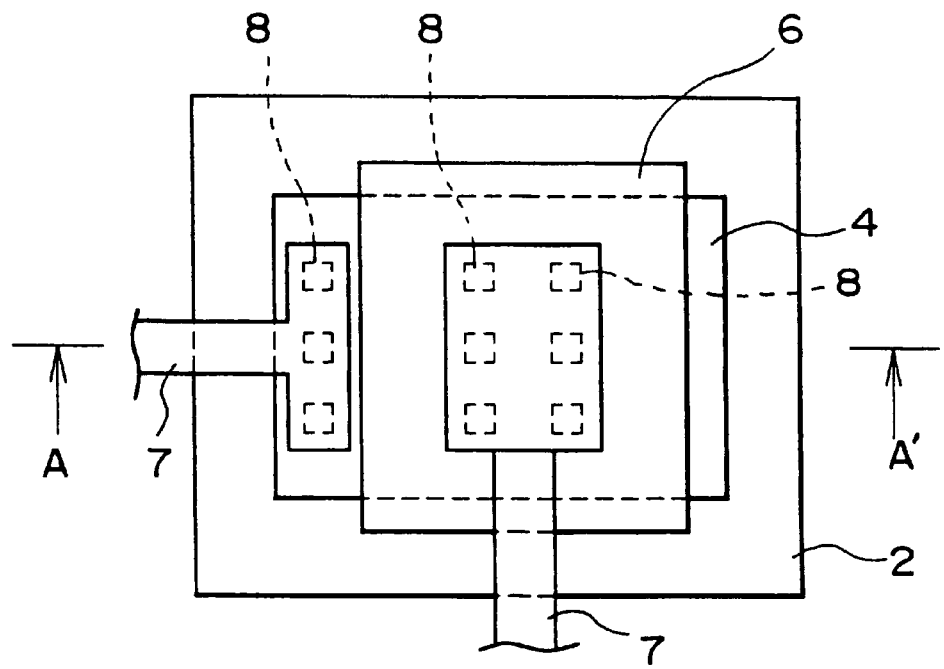
FIG. 25 is a schematic plan view illustrating a semiconductor capacitance device of the prior art.
Figure 26:
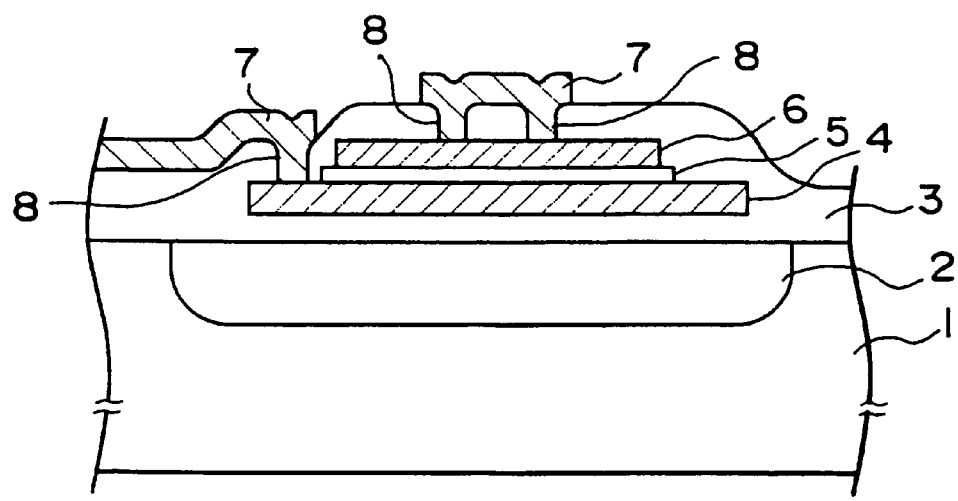
FIG. 26 is a cross-sectional view through the A–A' plane of FIG. 25.

Next, specific examples of semiconductor devices configured with the semiconductor capacitance device of the present invention are presented in reference to FIG. 22 through FIG. 24.

FIG. 22 shows an integrator comprising an operational amplifier 300, a resistor 304 provided in the middle of an input line 302 of the operational amplifier 300, and a capacitor 308 formed in the middle of a feed-back line 306 of the operational amplifier 300. The capacitor 308 is configured with any one of the semiconductor capacitance devices already described in the first through seventh embodiments, which is fabricated together with other configurations on the same substrate by means of a thin film processing.

The performance of the above integrator relies on the accuracy of resistance R of the resistor 304 and capacitance C of the capacitor 308. For the above reason, the processing precision of the integrator could be improved by reducing the voltage dependency of the capacitance C.

FIG. 23 shows a 6-bit capacity array type DAC (Digital Analogue Converter). The DAC has seven sets of capacitors 310 configured with any one of the semiconductor capacitance devices already described in the first through seventh embodiments. One end of one of the capacitors 310 is grounded, while one end each of the other six capacitors is fed with either a reference potential Vref or a ground potential, selectively through a MOS switch 312. Each of the MOS switches 312 are controlled and switched based on the binary data input B1 through B6. The other ends of the seven capacitors 310 are connected together, and the potential of the common connector line 314 is put out as Vout through a buffer 316. Note that an initializing switch 318 is provided to initialize the potential of the common connector line 314.

The linearity of the above DAC is determined by the integer ratio accuracy of the seven capacitors 310. Because the potential applied to the seven capacitors 310 varies depending on the binary data, reducing the voltage dependency of the capacitance will improve the linearity of the DAC.

FIG. 24 shows an RC active filter circuit. The RC active filter circuit comprises multiple resistors R1 through R10, multiple capacitors C1 through C3, and a plurality of operational amplifier OP1 through OP3. The capacitors C1 through C3 are configured with any one of the semiconductor capacitance devices already described in the first through seventh embodiments, and are fabricated together with other configurations on the same substrate by means of a thin film processing.

The characteristic frequency of the above RC active filter is determined by the product of resistance and the capacitance (i.e. RC time constant). Therefore, reducing the voltage dependency of the capacitance will improve the filtering precision.

It should be noted here that the circuits presented in FIGS. 22 through 24 are but a few examples of applying the semiconductor capacitance device or semiconductor device of the present invention, and it is obvious that the present invention could well be applied to various types of circuits wherein performance could be improved by the reduction of the voltage dependency of capacitance.

While the present invention has been described in accordance with the preferred embodiments thereof, it is to be understood that the present invention is not limited to the aforementioned embodiments, as various alternatives, variations and modifications may be made without departing from the spirit and scope of the present invention.

For example, the variations of combining semiconductor types for the first electrode, the second electrode, the third electrode, and the fourth electrode that constitute the semiconductor capacitance device of the present invention are not limited to ($N^+$, $N^+$, $N^+$, $P^+$) in the first embodiment, or ($N^+$, N-well, $N^+$, P-well) in the seventh embodiment, but also could well be ($N^+$, $N^-$, $N^+$, $P^-$), ($P^+$, $N^-$, $P^+$, $P^-$), ($P^+$, P-well, $P^+$, N-well), and the like.

What is claimed is:

1. A semiconductor capacitance device comprising:
   a first semiconductor capacitive element having a first voltage dependency factor K1;
   a second semiconductor capacitive element having a second voltage dependency factor K2 with a gradient sign inverse of said first voltage dependency factor K1; and
   wiring layers connecting the first and second capacitive elements in at least one of a parallel and a series connection,
   wherein an effective area of said first semiconductor capacitive element S1 and an effective area of said second semiconductor capacitive element S2 are set according to $|K1 \cdot S1/(S1+S2)+K2 \cdot S2/(S1+S2)|<100$ ppm/V.

2. The semiconductor capacitance device according to claim 1, wherein the effective area of said first semiconductor capacitive element S1 and the effective area of said second semiconductor capacitive element S2 are set to be S1>S2 when $|K1|<|K2|$.

3. The semiconductor capacitance device according to claim 2, wherein the conditions are set to accomplish $|K1 \cdot S1| \approx |K2 \cdot S2|$.

4. A semiconductor device comprising:
   a substrate on which a semiconductor capacitance device described in claim 1 is formed; and
   a transistor formed on said substrate.

5. A semiconductor capacitance device comprising:
   a first capacitive element; and
   a second capacitive element connected to said first capacitive element in at least one of a parallel and a series connection,
   wherein said first capacitive element has a first electrode layer; and
   a second electrode layer comprising a semiconductor of a first conduction type and being arranged so that it faces said first electrode layer with a first interposed dielectric layer, and
   wherein said second capacitive element has a third electrode layer; and
   a fourth electrode layer comprising a semiconductor of a second conduction type and being arranged so that it faces said first electrode layer with a second interposed dielectric layer,
   wherein said first electrode layer of said first capacitive element and said third electrode layer of said second capacitive element are formed with a semiconductor of one of said first and second conduction type, and
   wherein the impurity concentration in said second electrode layer is set at a concentration lower than that of said first electrode layer, and that the impurity concentration of said fourth electrode layer is set at a concentration lower than that of said third electrode layer.

6. The semiconductor capacitance device of claim 5, wherein said first electrode layer of said first capacitive element and said third electrode layer of said second capacitive element are formed with an identical material in the same fabrication step.

7. The semiconductor capacitance device according to claim 6, wherein said first electrode layer and said third electrode layer are formed as one contiguous electrode layer in a position facing said second electrode layer and said fourth electrode layer.

8. The semiconductor capacitance device according to claim 5, wherein said second electrode layer is formed with a well of said first conduction type, and said fourth electrode layer is formed with a well of said second conduction type.

9. The semiconductor capacitance device according to claim 8, wherein both said first and second capacitive elements are MOS capacitors.

10. The semiconductor capacitance device according to claim 5, wherein the semiconductor of said first conduction type constituting said second electrode layer of said first capacitive element and the semiconductor of said second conduction type constituting said fourth electrode layer of said second capacitive element are connected with a semiconductor junction.

11. The semiconductor capacitance device according to claim 5, wherein, when the facing area between said first and second electrode layers of said first capacitive element is defined as S1, and the facing area between said third and fourth electrode layers of said second capacitive element is defined as S2, each of areas S1 and S2 is arranged to differ from each other.

12. The semiconductor capacitance device according to claim 11, wherein a voltage dependency factor of said first capacitive element is defined as K1, and a voltage dependency factor of said second capacitive element is defined as K2, and when $|K1|<|K2|$, said areas S1 and S2 are set to be S1>S2.

13. The semiconductor capacitance device according to claim 11, wherein a voltage dependency factor of said first capacitive element is defined as K1, and a voltage dependency factor of said second capacitive element is defined as K2, and when $|K1|>|K2|$, said areas S1 and S2 are set to be S1<S2.

14. The semiconductor capacitance device according to claim 12, wherein the conditions are set to accomplish $|K1 \cdot S1/(S1+S2)+K2 \cdot S2/(S1+S2)|<100$ ppm/V.

15. The semiconductor capacitance device according to claim 12, wherein the conditions are set to accomplish $|K1 \cdot S1| \approx |K2 \cdot S2|$.

16. A semiconductor device comprising a substrate on which the semiconductor capacitance device as described in claim 5 is formed; and at least one transistor formed on said substrate and including a drain region, a source region, and a gate electrode.

17. The semiconductor device according to claim 16, wherein said second electrode layer, said fourth electrode layer, and said gate electrode are formed using an identical material to be deposited in the same step.

18. The semiconductor device according to claim 16, wherein:

semiconductor substrate has a field oxide layer; and said first and second semiconductor capacitance elements are formed on said field oxide layer.

19. The semiconductor device according to claim 16, wherein:

at least one of said transistors comprises said source and drain formed in a well region of said second conduction type; and said second electrode layer of the first capacitive element is implanted with impurity ions using the same step for implanting ions into the well region of said second conduction type of at least one of said transistor.

20. The semiconductor device according to claim 16, wherein:

at least one of said transistors comprises said source and drain formed in a well region of said first conduction type; and said fourth electrode layer of said second capacitive element is implanted with impurity ions using the same step for implanting ions into the well region of said first conduction type.

21. The semiconductor device according to claim 16, wherein at least one of said transistors comprises:

a first transistor comprising said source and drain formed in a well region of said second conduction type; and a second transistor comprising said source and drain formed in a well region of said first conduction type, wherein said second electrode layer of the first capacitive element is implanted with impurity ions using the same step for implanting ions into the well region of said first conduction type, and wherein said fourth electrode layer of said second capacitive element is implanted with impurity ions using the same step for implanting ions into the well region of said second conduction type.

22. The semiconductor capacitance device according to claim 5, wherein the first and second interposed dielectric layers are formed by the same material at the same layer.

23. The semiconductor capacitance device according to claim 5, wherein the first and second interposed dielectric layers are formed at a different layer respectively.

* * * * *